United States Patent
Kurata

[11] Patent Number: 6,114,929
[45] Date of Patent: Sep. 5, 2000

[54] MAGNETOSTATIC WAVE DEVICE WITH SPECIFIED DISTANCES BETWEEN MAGNETIC GARNET FILM AND GROUND CONDUCTORS

[75] Inventor: Hitoyoshi Kurata, Chiba, Japan

[73] Assignee: TDK Corporation, Tokyo, Japan

[21] Appl. No.: 09/247,590

[22] Filed: Feb. 10, 1999

Related U.S. Application Data

[63] Continuation of application No. PCT/JP98/02910, Jun. 29, 1998.

[51] Int. Cl.$^7$ .............................. H01P 7/00; H01P 1/215
[52] U.S. Cl. ........................................ 333/202; 333/219.2
[58] Field of Search ............................... 333/202, 219.2, 333/201

[56] References Cited

U.S. PATENT DOCUMENTS

| | | | |
|---|---|---|---|
| 4,547,754 | 10/1985 | Murakami et al. | 333/219.2 |
| 4,679,015 | 7/1987 | Murakami et al. | 333/219.2 |
| 4,751,480 | 6/1988 | Kunz et al. | 333/219.2 |
| 4,782,312 | 11/1988 | Chang et al. | 333/219 |
| 4,945,324 | 7/1990 | Murakami et al. | 333/219.2 X |
| 4,983,936 | 1/1991 | Murakami et al. | 333/219.2 X |
| 5,309,127 | 5/1994 | Mariani | 333/219.2 X |

FOREIGN PATENT DOCUMENTS

| | | |
|---|---|---|
| 1-236723 | 9/1989 | Japan . |
| 1-303901 | 12/1989 | Japan . |
| 2-305014 | 12/1990 | Japan . |
| 6-085507 | 3/1994 | Japan . |

OTHER PUBLICATIONS

Asao, et al., The Transaction of IEICE C–I, vol. J77–C–I, No. 12, pp. 754–762, "Tuning Oscillator Having Wide Strip Transducer and Using Magnetostatic Forward Traveling Volume Wave", Dec. 1994.

Makoto Tsutsumi, et al., Technical Research Report of IEICE MW–82–65, vol. 82, No. 178, pp. 36–44, "YIG Thin–Film Resonator", Nov. 20, 1982.

D. A. Zeskind, et al., IEEE Transactions on Magnetics, vol. Mag–13, No. 5, pp. 1249–1251, "Localized High–Q Ferromagnetic Resonance in Nonuniform Magnetic Fields", Sep., 1977.

Y. Murakami, et al., IEEE MTT–S Digest, pp. 285–288, "A Bandpass Filter Using YIG Film Grown by LPE", 1985.

Michael R. Daniel, et al., J, Appl. Phys. vol. 53, No. 5, pp. 3723–3729, Magnetostatic Volume Wave Propagation in a Ferrimagnetic Double Layer$^{a)}$", May, 1982.

*Primary Examiner*—Robert Pascal
*Assistant Examiner*—Barbara Summons
*Attorney, Agent, or Firm*—Oblon, Spivak, McClelland, Maier & Neustadt, P.C.

[57] ABSTRACT

A magnetostatic wave device including a magnetic garnet film which excites and propagates magnetostatic waves upon receiving electromagnetic waves, a magnetic field generator which applies a magnetic field to the magnetic garnet film, first and second ground conductors opposing each other and sandwiching the magnetic garnet film therebetween, and an RF signal feeder line disposed between the magnetic garnet film and the first ground conductors. The first ground conductor has an opposing surface opposed to one main surface of the magnetic garnet film. The second ground conductor has an opposing surface opposed to the other main surface of the magnetic garnet film. In the device, $t_1 \geq t_R + 5 \ \mu m$ $t_2 \geq 0 \ \mu m$, and $t_1 + t_2 \leq 500 \ \mu m$, where $t_1$ is a distance between the opposing surface of the first ground conductor and the one main surface of the magnetic garnet film, $t_2$ is a distance between the opposing surface of the second ground conductor and the other opposing surface of the magnetic garnet film and $t_R$ is a thickness of the RF signal feeder line.

17 Claims, 5 Drawing Sheets

MAGNETOSTATIC WAVE DEVICE WITH SPECIFIED DISTANCES BETWEEN MAGNETIC GARNET FILM AND GROUND CONDUCTORS

This is a continuation of International Application PCT/JP98/02910, with an international filing date of Jun. 29, 1998; claiming priority from Japanese Application 9-214083 filed on Jul. 24, 1997.

TECHNICAL FIELD

The present invention relates to a magnetostatic wave device, particularly to a magnetostatic wave device capable of increasing loaded Q when it is applied to a resonator, a filter, and the like.

TECHNICAL BACKGROUND

Figure 1:
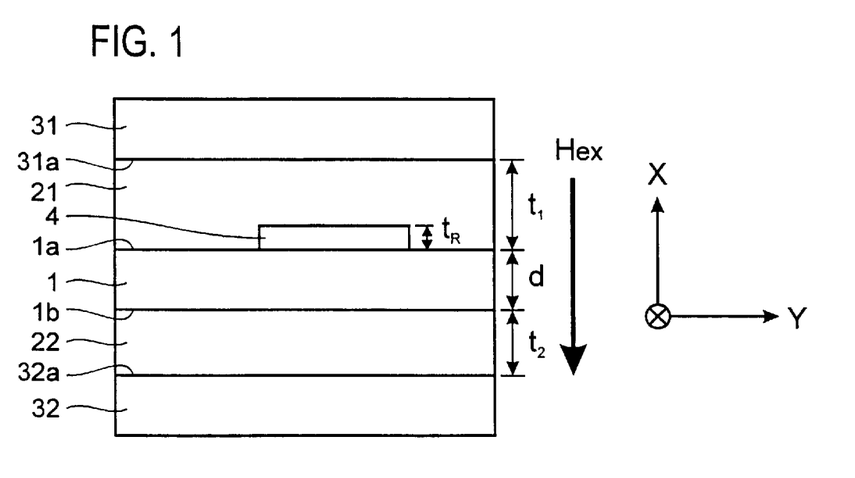
FIG. 1 is a model drawing for explaining the function of a magnetostatic wave device.

FIG. 1 shows a model for explaining the function of a magnetostatic wave device. This magnetostatic wave device model has a magnetic garnet film 1 through which excited magnetostatic waves propagate, an RF signal feeder line 4 formed on one main surface 1a of the magnetic garnet film 1, a ground conductor 31 formed on the upper side of the magnetic garnet film 1 and the RF signal feeder line 4 through a dielectric 21, and a ground conductor 32 formed on the lower side of the magnetic garnet film 1 through a dielectric 22. In this model, when an external magnetic field Hex is applied in the negative direction of the X axis and when RF signals are fed to the RF signal feeder line 4, electromagnetic waves generated are converted to magnetostatic waves due to magnetic coupling, and the magnetostatic waves (magnetostatic forward volume waves) propagate through the magnetic garnet film 1 so as to be parted and to move apart from each other in the positive and negative directions of the Y axis. The dielectrics 21 and 22 in an actual device are constituted, e.g., of a non-magnetic garnet substrate or air. The dielectric constants of these two dielectrics may be the same or different.

In the above magnetostatic wave device model, when the magnetic garnet film 1 has a thickness d and a specific magnetic permeability $\mu r$, when the distance between one main surface 1a of the magnetic garnet film 1 (surface on which the RF signal feeder line 4 is formed) and a surface 31a of the ground conductor 31 opposing thereto is $t_1$, and when the distance between the other main surface 1b of the magnetic garnet film 1 and a surface 32a of the ground conductor 32 opposing thereto is $t_2$, the magnetostatic waves satisfy the dispersion relation:

$$e^{2dM} = \frac{(M - N\tanh Nt_2)(M - N\tanh Nt_1)}{(M + N\tanh Nt_2)(M + N\tanh Nt_1)}.$$

In the above expression, $M^2 = \mu_r(k_y^2 + K_z^2)$ $N^2 = K_y^2 + K_z^2$

Ky=Wave number of magnetostatic wave propagating in the Y axis direction kz=Wave number of magnetostatic wave propagating in the Z axis direction $$\mu_r = 1 - \frac{\omega_h \omega_m}{\mu_0(\omega^2 - \omega h^2)}$$

$\omega_h = \gamma \cdot \text{Hin}$

Hin: Internal magnetic field intensity (A/m)

$\omega_m = \gamma \cdot (\text{Ms})$

Ms: Saturation magnetization (Wb/m$^2$)

$\omega = 2\pi f$ f: Frequency (Hz)

$\gamma = 2.21 \times 10^5$

Gyromagnetic ratio (m/A·s)

$\mu_0 = 12.566 \times 10^{-7}$ (H/m)

In the above expression, $t_1$ and $t_2$ may have any arbitrary values. In a conventional magnetostatic wave device, however, $t_1$ and $t_2$ have been said to be certain finite values and have been generally set, e.g., at $t_1+t_2$=about 1 mm, as will be described later.

Figure 4:
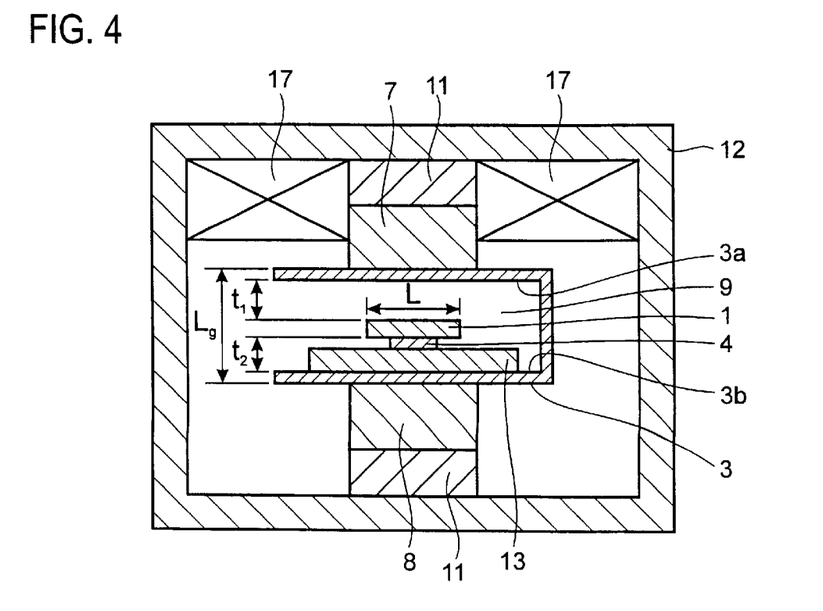
FIG. 4 is a cross-sectional view showing a configuration example of a magnetostatic wave device.

FIG. 4 shows a configuration example of a conventional magnetostatic wave device. This configuration example has a pair of magnetic pole pieces opposing to each other, a semi-square-shaped ground conductor 3 sandwiched between magnetic pole pieces 7 and 8 and internal void 9, permanent magnets 11 magnetically connected to the magnetic pole pieces 7 and 8, a yoke 12 magnetically connected to the permanent magnets 11, a magnetic garnet film 1 disposed in the semi-square-shaped ground conductor 3, and a dielectric substrate 13 supporting the magnetic garnet film 1, an RF signal feeder line 4 being between the magnetic garnet film 1 and the dielectric substrate 13. Coils 17 are wound around the circumferences of the permanent magnet 11 and the magnetic pole piece 7.

The magnetic pole pieces 7 and 8 and the yoke 12 are constituted of materials such as iron, Permalloy, etc., and the semi-square-shaped ground conductor 3 is therefore disposed so as to surround the RF signal feeder line 4 for the purpose of blocking out electromagnetic wave radiation against the magnetic pole pieces 7 and 8 such that the feed signal suffers no loss at high frequency. The magnetic garnet film 1 is, for example, a YIG (yttrium iron garnet) film, etc., produced by a LPE (liquid-phase epitaxial) method.

An external magnetic field is applied to the magnetic garnet film 1 in the void 9 with a pair of the magnetic pole pieces 7 and 8. The external magnetic field is composed of a fixed magnetic field by the permanent magnets 11 and a variable magnetic field by the coils 17, wherefore the regulation of electric currents in the coils 17 controls the intensity of the external magnetic field applied to the magnetic garnet film 1. When a microwave signal or a quasi-microwave signal is fed to the RF signal feeder line (antenna) 4 formed of a microstripline, etc., an electromagnetic wave produced is converted to a magnetostatic wave having a frequency depending upon the intensity of the above external magnetic field, and propagates through the magnetic garnet film 1.

For example, a magnetostatic wave which propagates toward a side surface of the magnetic garnet film formed rectangularly is reflected from the side surface to go back in the counter direction. The magnetostatic wave having the same phase as the phase of the inputted electromagnetic wave is coupled and resonates in the rectangular magnetic garnet film. The wavelength which is the greatest of the wavelengths of the magnetostatic wave resonating at this time is twice, 2L, as large as the length L of the rectangular magnetic garnet film.

A magnetostatic wave device of a resonator structure using a magnetic garnet such as YIG shows a very large unloaded Q value (to be referred to as unloaded $Q_u$, or simply as $Q_u$, hereinafter) in a microwave band and a quasi-microwave band. It is thus expected that such device find some interesting applications. However, for a magnetostatic wave device to be practical, it is essential that the loaded Q value (to be referred to as loaded $Q_1$, or simply as $Q_1$, hereinafter) is large.

The refference "A BANDPASS FILTER USING YIG FILM GROWN BY LPE", 1985 IEEE MTT-S Digest, Y. Murakami and S. Ito, Sony Corporation describes that when the above magnetostatic wave device is measured for an external Q value (to be referred to as external $Q_e$ or simply as $Q_e$, hereinafter) while being operated as a band stop filter, the external $Q_e$ increases with a decrease in the thickness of a YIG film. The above reference uses a disc-shaped YIG film. The above reference describes nothing concerning loaded $Q_1$, while the relationship of external $Q_e$, unloaded $Q_u$ and loaded $Q_1$ is generally expressed by $$1/Q_1 = 1/Q_u + 1/Q_e$$

and if the external $Q_e$ increases with a decrease in the thickness of a YIG film, loaded $Q_1$ ought to increase, since unloaded $Q_u$ is constant regardless of the plane form and the thickness of a YIG film.

The present inventor has carried out a duplicate experiment using a rectangular magnetic garnet according to the method shown in the above reference, and has measured a loaded $Q_1$. As a result, as can be presumed from the above reference, it has been found that the loaded $Q_1$ increases with a decrease in the thickness of a magnetic garnet film. Further, it has been revealed that the loaded $Q_1$ found in the measurement by the present inventor is appreciably smaller than the loaded $Q_1$ calculated on the basis of $1/Q_1 = 1/Q_u + 1/Q_e$.

While it has been found that it is sufficient to decrease the thickness of a magnetic garnet film for an increase in loaded $Q_1$, problems to be shown below are liable to occur when the thickness of a magnetic garnet film is decreased. For example, when the surface of a magnetic garnet film is polished for improving its flatness, the parallelism of the two main surfaces of the film becomes poor, and the film thickness is sometimes non-uniform. In this case, the ratio of a change in the film thickness, caused by the worsening of the parallelism, increases as the film decreases in thickness. If the thickness of a magnetic garnet film varies, the dispersion relation of the magnetostatic wave varies from one position to another. When the non-uniformity of the film thickness is large, therefore, standing wave as designed can be no longer generated, and the characteristics deteriorate. It is therefore desirable to increase the loaded $Q_1$ by means different from the decreasing of the thickness of a magnetic garnet film.

Meanwhile, it is also essential to downsize a magnetostatic wave device. In the configuration shown in FIG. 4, the magnetic pole pieces 7 and 8, the void 9, the yoke 12 and the permanent magnets 11 constitute a magnetic field generator. A smaller space of the void 9 is desirable since the magnetic field generator can be decreased in size, as is well known. For example, the magnetostatic wave device described in JP-A-1-303901 is devised to narrow the distance Lg between the magnetic pole pieces 7 and 8 into 1.15 mm by using a conductor film having a thickness of 2 to 100 μm to constitute its semi-square-shaped ground conductor. In this case, the height of the void 9, i.e., the distance between one opposing surface 3a and the other opposing surface 3b of the semi-square-shaped ground conductor 3 is approximately 1 mm.

SUMMARY OF THE INVENTION

It is an object of the present invention to increase the loaded Q value and at the same time to downsize the magnetic field generator in a magnetostatic wave device which is applied for a resonator or a filter.

The above object is achieved by the following device:

The magnetostatic wave device includes a magnetic garnet film for exciting and propagating magnetostatic wave, a magnetic field generator for applying a magnetic field to the magnetic garnet film, a pair of ground conductors opposing each other and sandwiching the magnetic garnet film therebetween, and an RF signal feeder line disposed between the magnetic garnet film and one of the ground conductors. One of the ground conductors has an opposing surface opposed to one main surface of the magnetic garnet film, and the other ground conductor has an opposing surface opposed to the other main surface of the magnetic garnet film, wherein $t_1 \geq t_R + 5$ μm $t_2 \geq 0$ μm, and $t_1 + t_2 \leq 500$ μm in which $t_1$ is a distance between the opposing surface of the said one ground conductor and the said one main surface of the magnetic garnet film, $t_2$ is a distance between the opposing surface of the said other ground conductor and the said other opposing surface of the magnetic garnet film and $t_R$ is a thickness of the RF signal feeder line.

In the present invention, the distance between a pair of the ground conductors sandwiching the magnetic garnet film in the magnetostatic wave device is controlled to be within a predetermined range, whereby the loaded $Q_1$ in practical use can be improved independently of various conditions such as the length of the magnetic garnet film, the width thereof, the thickness thereof, the saturation magnetization, an external magnetic field intensity to be applied to the magnetic garnet film, and the like.

Further, since the distance between a pair of the ground conductors is decreased as compared with a conventional device, the magnetic field generator can be downsized.

DESCRIPTION OF THE PREFERRED EMBODIMENTS

Figure 2:
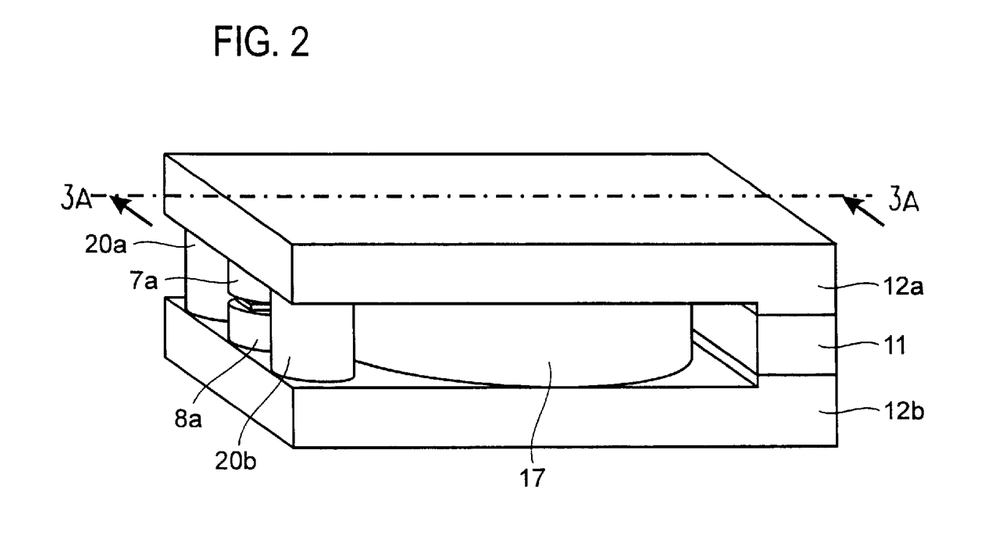
FIG. 2 is a perspective view showing a configuration example of a magnetostatic wave resonator.

FIG. 2 shows a preferred embodiment of the a magnetostatic wave resonator of the present invention. Further, FIG.

Figure 3A:
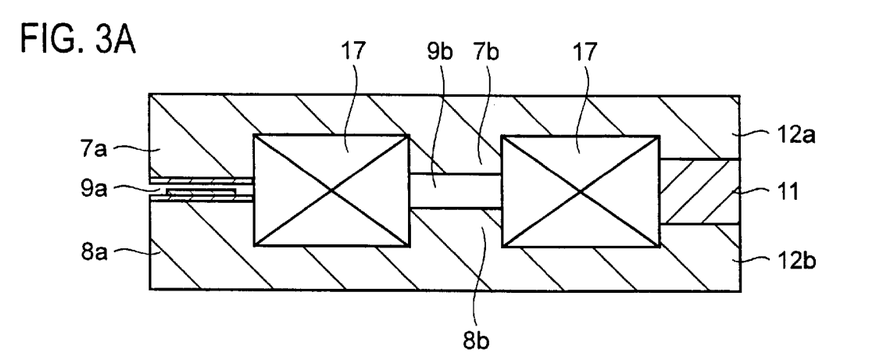
FIG. 3A is a cross-sectional view showing a line-3A—3A-including vertical cross section of the magnetostatic wave resonator shown in FIG. 2.
Figure 3B:
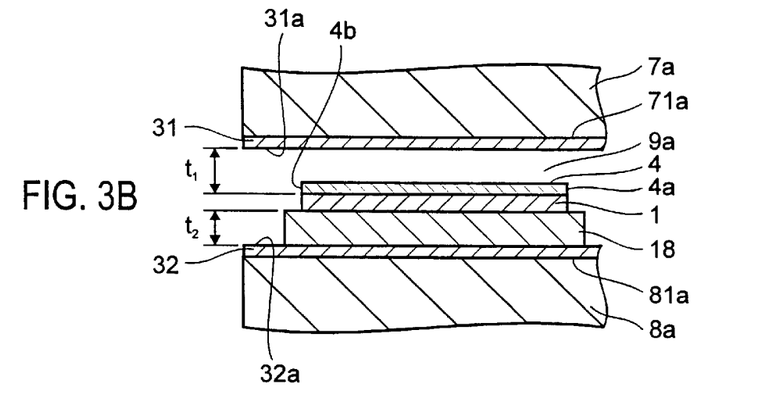
FIG. 3B is an enlarged view of vicinities of a void 9a in FIG. 3A.

3A shows a section of the magnetostatic wave resonator along the line 3A—3A, and FIG. 3B shows a partially enlarged view of FIG. 3A. FIG. 3A and FIG. 3B only show cross-sectional surfaces excluding the depth direction.

This magnetostatic wave device has a pair of ground conductors 31 and 32 having a potential equal to the ground potential, and these are disposed so as to be opposed to each other. A GGG (gadolinium·gallium·garnet) substrate 18 is present in a void 9a between the two ground conductors, and a magnetic garnet film 1 of YIG, or the like, is formed on the GGG substrate 18. An RF signal feeder line 4 for feeding RF signal current is formed on the magnetic garnet film 1, and a magnetic field generator is disposed for perpendicularly applying a DC magnetic field to the film surface of the magnetic garnet film 1. The RF signal feeder line can be present between one ground conductor and the magnetic garnet film, and it is not required to be in contact with the magnetic garnet film. For example, there may be an adhesive layer, etc., between the magnetic garnet film and the RF signal feeder line.

Generally, the GGG substrate 18 has a thickness of approximately 400 μm or less, the magnetic garnet film 1 has a width of approximately 0.5 to 2 mm, a length of approximately 0.5 to 2 mm, and a thickness of approximately 5 to 150 μm, preferably approximately 5 to 100 μm, more preferably approximately 5 to 40 μm, and the RF signal feeder line 4 has a thickness of approximately 2 to 15 μm. The GGG substrate is not essential, and the magnetic garnet film 1 and the ground conductor 32 may be in contact with each other.

The magnetic field generator has a permanent magnet 11, a pair of yokes 12a and 12b, a first magnetic pole piece pair composed of a pair of magnetic pole pieces 7a and 8a opposed to each other through the void 9a, a second magnetic pole piece pair composed of a pair of magnetic pole pieces 7b and 8b opposed to each other through a void 9b, and coils 17 wound around the magnetic pole pieces 7b and 8b. The coils 17 are used for generating a variable magnetic field and are disposed for controlling the intensity of a magnetic field to be applied to the magnetic garnet film 1. A pair of the yokes 12a and 12b are opposed to each other through the permanent magnet 11, "one" end portions thereof are magnetically connected to the permanent magnet 11, the magnetic pole pieces 7a and 8a are formed in the other end portions thereof, and the magnetic pole pieces 7b and 8b are formed between the above-described "one" end portions and the other end portions thereof. The void length of the void 9b is controlled, whereby the intensity of a magnetic field to be applied to the void 9a can be adjusted.

In the above magnetic field generator, generally, the void length of the void 9a is arranged to be smaller than the height of the permanent magnet 11, so that the magnetic flux generated by the coils 17 mainly goes through a magnetic path which does not pass through the permanent magnet 11, i.e., a magnetic path formed of the void 9b—the magnetic pole piece 7b—the yoke 12a—the magnetic pole piece 7a—the void 9a—magnetic pole piece 8a—the yoke 12b—the magnetic pole piece 8b.

In the shown example, one void for disposing the magnetic garnet film 1 is present, while at least two voids for disposing magnetic garnet films may be provided. In this case, the void lengths of a plurality of the voids are arranged to be different from each other, whereby resonance frequencies in the magnetic garnet films can be obtained at different frequencies. Therefore, for exmaple, a switch is employed, whereby it can be applied to VCO (voltage controlled oscillator) permitting the concurrent transmitting and receiving signals in at least two channel frequencies.

The yokes and the magnetic pole pieces are constituted of a high-magnetic-permeability material such as iron, Permalloy, and the like. Of these, iron is preferred in view of a cost, easiness in processing and a high saturated magnetic flux density. Since, however, iron causes a large loss concerning high-frequency signal, it is preferred to shield the magnetic generator including the yokes with a conductor film having a thickness of approximately 2 to 15 μm when iron is used. Specifically, it is preferred to cover the magnetic pole pieces 7a and 8a and the yokes 12a and 12b and the surfaces 71a and 81a of the magnetic pole pieces 7a and 8a with the above conductor film.

Supports 20a and 20b formed of a non-magnetic and electrically conductive material are disposed between a pair of the yokes 12a and 12b. For maintaining the space of the void 9a and for the purpose of bringing the opposing surfaces 71a and 81a of the magnetic pole pieces 7a and 9a into the same potential, it is preferable that, "one" end surfaces of the supports 20a and 20b be bonded to one yoke 12a through the above conductor film, and the other end surfaces are bonded to the other yoke 12b through the above conductor film, in the vicinities of the magnetic pole pieces 7a and 8a. For the above bonding, an electrically conductive adhesive such as a silver paste, or the like can be used.

The GGG substrate 18 on which the magnetic garnet film 1 is to be fixed is bonded to an opposing surface 32a of a conductor 32 with an electrically conductive adhesive such as a silver paste, and the like. In this case, the main surface of the GGG substrate 18 to which the opposing surface 32a of the conductor 32 is to be bonded has a conductor film of Au, Cu or the like formed in advance. This conductor film can be formed by a vapor deposition method, an electroless plating method, or the like, and the thickness thereof can be approximately 0.2 to 1 μm.

The RF signal feeder line 4 for feeding RF signal is formed on the magnetic garnet film 1 by a vapor deposition method and by photolithography. And, one end portion 4a of the RF signal feeder line 4 is connected to the opposing surface 32a of the ground conductor 32, and the other end 4b thereof is formed as an input/output terminal. The connection state of these is not shown.

Figure 5:
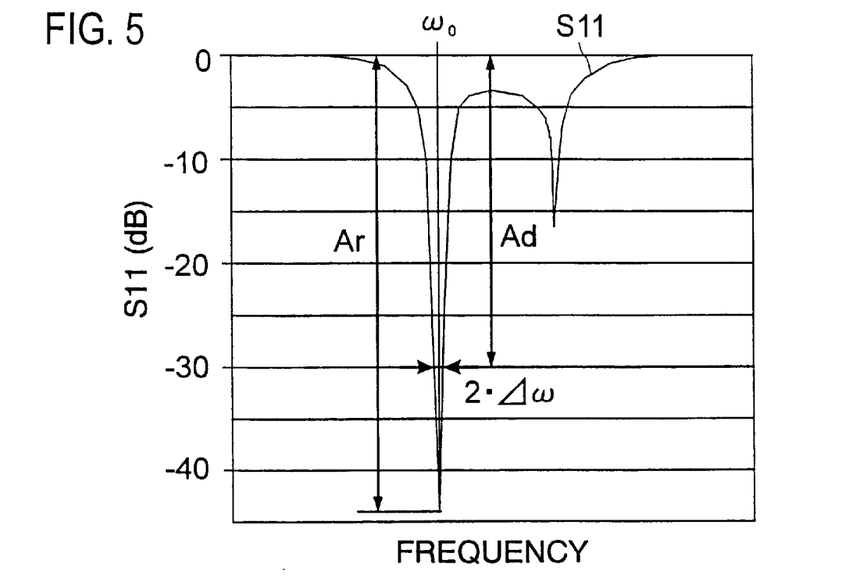
FIG. 5 is a graph for explaining a method of measuring loaded $Q_1$.

The method of determining loaded $Q_1$ by measuring S11 of the above magnetostatic wave resonator with a network analyzer will be explained with reference to FIG. 5 hereinafter. S11 when the coupling coefficient of a resonator is nearly 1 is measured with a network analyzer, S11 when no resonance occurs is taken as a reference value (0 dB), and a resonance absorption peak Ar relative to the reference value is measured. Then, a width 2·Δω of a resonance absorption is measured at a point Ad which is at least −30 dB apart from the reference value. In this case, Ar is preferably smaller than Ad by 10 to 20 dB. And, finally, a central frequency (peak frequency) of the resonance absorption is measured. This result is used to determine a loaded $Q_1$ on the basis of $$Q_1 = \omega_0/(K \cdot 2 \cdot \Delta\omega)$$

[wherein $K^2 = (1 - 10^{Ad/10})/(10^{Ad/10} - 10^{Ar/10})$].

This method was used to measure loaded Q1 at a frequency of 700 MHz at a saturation magnetization of 0.07 Wb/m² while 1 mm square magnetic garnet films were changed so as to have a thickness of 95 μm, 55 μm, 30 μm and 17 μm. The results are shown by the solid circle marks in FIG. 6. It is seen from FIG. 6 that the loaded $Q_1$ increases with a decrease in the thickness of the magnetic garnet films.

In this case, the GGG substrate was arranged to have a thickness of 200 μm, and $t_2$ in FIG. 1 is therefore 200 μm. Further, since the magnetic garnet films were open upwardly, $t_1=\infty$.

Then, for comparing measured values and calculated values of the loaded $Q_1$, the measured values and the calculated values of unloaded $Q_u$ of the magnetic garnet films used in the above experiment were determined. The measured values of the unloaded $Q_u$ were determined by the following procedures. First, a magnetic garnet film having a thickness of 95 μm was used as such, and the distance between an input/output electrodes was arranged to be 960 μm, to prepare a filter which showed an input power/output power ratio of at least 30 dB. The frequency $\omega_0$ of peak value of transmission characteristic (S21) of the filter and the frequency width $2\cdot\Delta\omega$, at a point where the transmission signal level was attenuated from the peak value by 3 dB, were used to determine a measured value of the unloaded $Q_u$ on the basis of $$Q_u=\omega_0/(2\cdot\Delta\omega).$$

Figure 7:
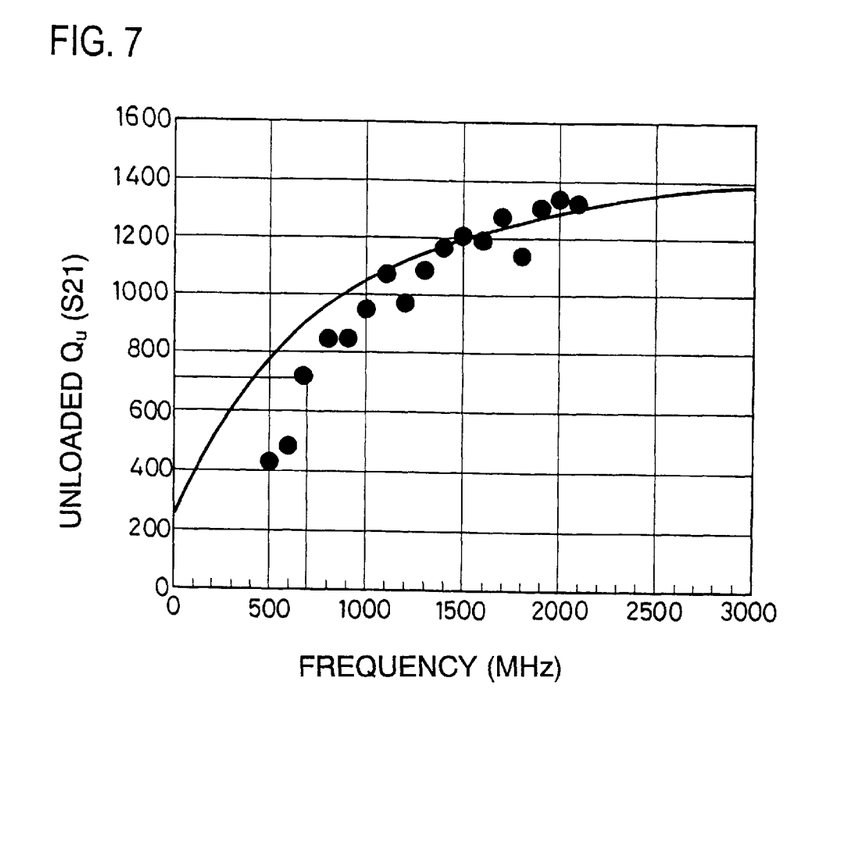
FIG. 7 is a graph showing measured values and calculated values of dependency of unloaded $Q_u$ upon frequency.

FIG. 7 shows the results as solid circles. On the other hand, a calculated value of the unloaded $Q_u$ of the magnetostatic wave resonator is given by $$Q_u=\omega_0/(\gamma\cdot\Delta H)$$

in which γ is a gyromagnetic ratio ($2.21\times10^5$ m/A·s), and ΔH is a half width of the ferromagnetic resonance. ΔH is 179.1 A/m when the resonance frequency is 9.55 Hz, and it decreases nearly in proportion to frequency. Further, an offset value is present. Therefore, $1.7512\times10^{-8}$ A·s/m was used as a gradient of ΔH, 9.552 A/m was used as an offset value, and they were substituted in the above expression, to determine a calculated value of $Q_u$. FIG. 7 shows the results by a solid line. It is seen from FIG. 7 that the measured values and the calculated values of the unloaded $Q_u$ are approximately in agreement. It is because ΔH gradually increases due to a low magnetic field loss that, in FIG. 7, the measured values deviate from the calculated values in a frequency region of 1.5 GHz or smaller.

Figure 6:
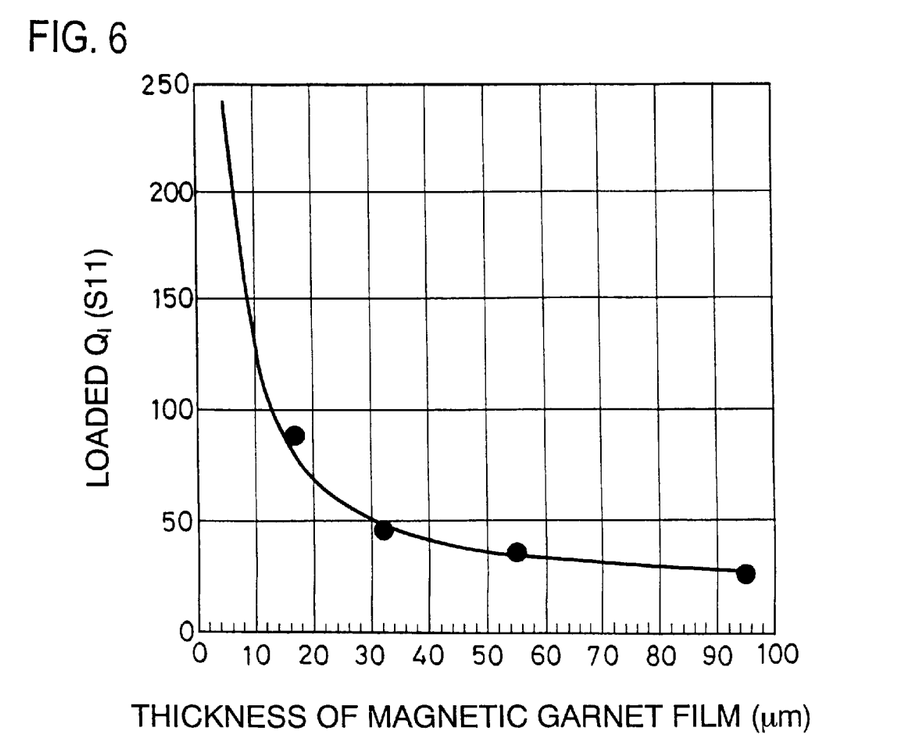
FIG. 6 is a graph showing a relationship between the thickness of a magnetic garnet film and loaded $Q_1$.

Then, a calculated value of the loaded $Q_1$ was determined on the basis of the unloaded $Q_u$. In this case, the relation of $$1/Q_1=1/Q_u+1/Q_t$$

was used, in which $1/Q_t$ refers to a reciprocal number sum of a $Q_s$ value based on a conductor loss and a radiation loss of a microstripline formed on a magnetic garnet film and a dielectric loss and a $Q_0$ value based on other factors. As shown in FIG. 7, the measured value of the unloaded $Q_u$ was about 700 at a frequency of 700 MHz, wherefore a circuit prepared by connecting an equivalent parallel resonator of a YIG resonator having the above value and a microstripline in series is simulated with a 50 Ω port to determine a loaded $Q_1$. The result is that the loaded $Q_1$ is 300 to 350 even if it is taken into consideration that the conductor loss varies to a great extent depending upon the thickness and the width of the microstipline. However, the measured value of the loaded $Q_1$ is very small, as small as 100 or less, as shown in FIG. 6. When it was therefore considered that the actual loaded $Q_1$ decreases as above and that the loaded $Q_1$ improves with a decrease in the thickness of a magnetic garnet film for the following reason, there were obtained results in which calculated values and measured values of the $Q_1$ were well in agreement.

Figure 8:
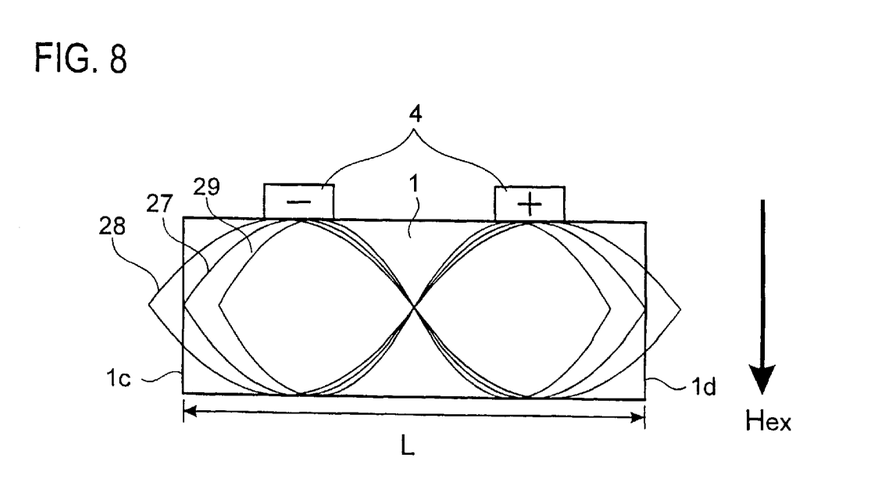
FIG. 8 is a figure for explaining magnetostatic wave standing wave generated in a magnetic garnet film.

FIG. 8 shows a relationship of a rectangular magnetic garnet film 1, standing waves generated therein at resonance and an exciting electrode (RF signal feeder line 4). It is to be assumed that an external magnetic field Hex is applied perpendicularly to the film surface of the magnetic garnet film 1. It is generally assumed that, in side surfaces 1c and 1d of the magnetic garnet film 1, i.e., a boundary of the inside of the film and the outside of the film, a DC magnetic field intensity comes to be discrete due to an anti-magnetic field of the magnetic garnet film, so that magnetostatic wave which has propagated through the magnetic garnet film 1 is nearly completely pinned in the side surfaces 1c and 1d to be totally reflected. And, in the case of FIG. 8, it is assumed that standing wave having a basic mode of a distance L between the opposing side surfaces 1c and 1d is generated to cause a resonance.

Figure 9:
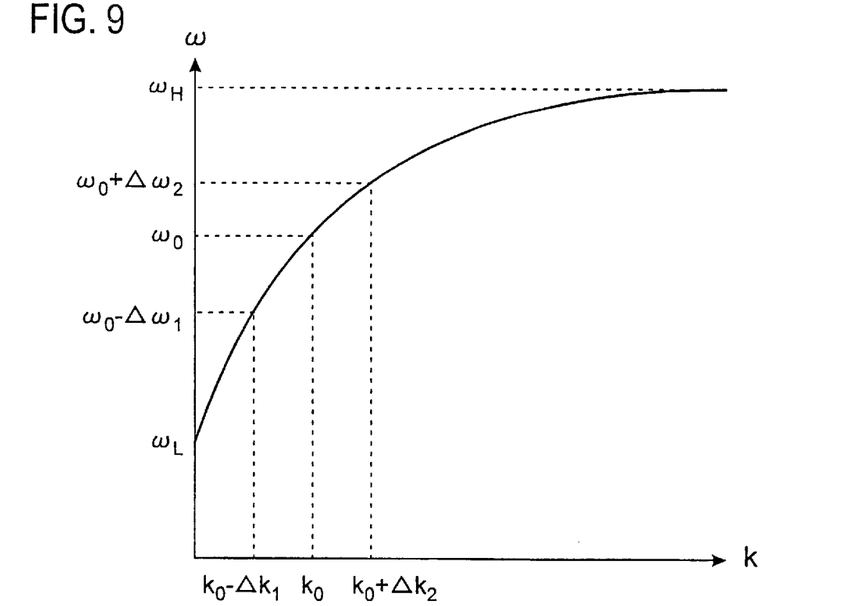
FIG. 9 is a graph showing a relationship between wave number k and resonance frequency ω.

In reality, however, in addition to a standing wave 27 which resonates at a frequency of $\omega_0$, a standing wave 28 having a longer wavelength (frequency $\omega_0-\Delta\omega_1$) and a standing wave 29 having a smaller wave length (frequency $\omega_0+\Delta\omega_2$) are generated. This point will be explained with reference to FIG. 9. FIG. 9 is a graph showing a relationship between the frequency and the wave number ($k=2\pi/\lambda$: k has the same meaning as that of $k_y$ in the already described dispersion relation and λ is a wavelength) determined on the basis of the already described dispersion relation of magnetostatic wave. In FIG. 9, $\omega_L$ and $\omega_H$ are respectively a lower-limit frequency and an upper limit frequency of magnetostatic wave which can be excited when an external magnetic field having a predetermined intensity is applied. When the intensity of an external magnetic field to be applied is constant, it is considered on the basis of FIG. 9 that the resonance frequency of the standing wave having a longer wavelength becomes lower than the frequency $\omega_0$ and that the resonance frequency of the standing wave having a smaller wavelength becomes higher than the frequency $\omega_0$. That is, it is assumed that due to the incomplete pinning on the side surfaces 1c and 1d of the magnetic garnet film 1, standing waves having a longer wavelength and a smaller wavelength are generated in the wave number range of from $k_0-\Delta k_1$ to $k_0+\Delta k_2$ in addition to the standing wave 27 which resonates at a wave number of $k_0$ corresponding to a frequency $\omega_0$, and respectively cause resonances in the frequency range of from $\omega_0-\Delta\omega_1$ to $\omega_0+\Delta\omega_2$, and that, therefore, the width of ferrimagnetic resonance at the central frequency $\omega_0$ is broadened so that the loaded $Q_1$ decreases.

On the basis of the above assumption, various values of $\Delta k_1$ and $\Delta k_2$ were employed and substituted in the dispersion relation of magnetostatic wave, the frequency $\omega_0$ having a wave number of $k_0$ was used as a central frequency, expansion widths $\Delta\omega_1+\Delta\omega_2$ of ferrimagnetic resonance caused in the range of from $k_0-\Delta k_1$ to $k_0+\Delta k_2$ were determined, loaded $Q_1=\omega_0/(\Delta\omega_1+\Delta\omega_2)$ were calculated, and the calculated values were compared with measured values. As a result, it has been found that calculated values when $\Delta k_1$ and $\Delta k_2$ are 660 to 730/m are well in agreement with measured values. FIG. 6 shows calculated values when $\Delta k_1=\Delta k_2=700$/m, by a solid line. On the basis of this result, it is considered that the low loaded $Q_1$ of the magnetostatic wave resonator is mainly caused by the incomplete pinning of magnetostatic waves.

In the actual measurement, a 1 mm square magnetic garnet film, i.e., a magnetic garnet film having a length L of 1 mm, was used, and an RF signal feeder line 4 having a structure shown in FIG. 8 was formed thereon, to prepare an exciting electrode. In this case, when the wavelength (basic wavelength) at a wave number of $k_0$ is $\lambda_0$, $\lambda_0=1$ mm is obtained, and $\Delta k_1=\Delta k_2=700$/m corresponds to a wavelength difference of about 110 μm. It is considered that standing waves having various wavelengths in the range of $\lambda_0\pm$about 11% are present in the magnetic garnet film with corresponding to frequencies in the range of from $\omega_0-\Delta\omega_1$ to $\omega_0+\Delta\omega_2$ where $\omega_0$ is the central frequency.

Figure 10:
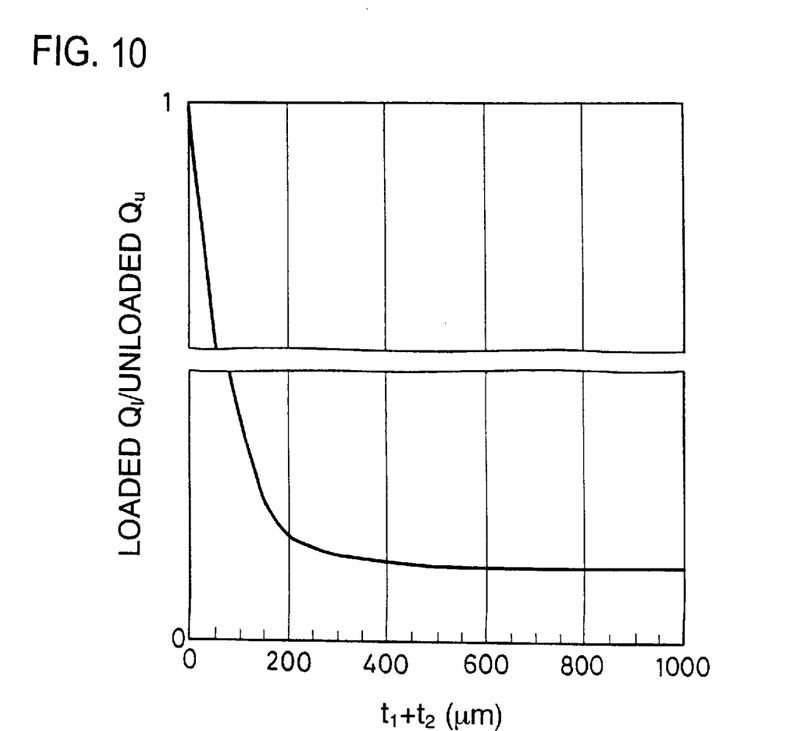
FIG. 10 is a graph showing a relationship between loaded $Q_1$/unloaded $Q_u$ and $t_1+t_2$.

On the basis of the above assumption, i.e., the assumption that standing waves having various wavelengths in the range of $\lambda_0$ ±about 11% are present in the magnetic garnet film with corresponding to frequencies in the range of from $\omega_0-\Delta\omega_1$ to $\omega_0+\Delta\omega_2$, changes of the loaded $Q_1$ were studied by changing various conditions with regard to the magnetic garnet film. As a result, it has been confirmed that the loaded $Q_1$ is improved by keeping the distance between the two ground conductors sandwiching the magnetic garnet film at a predetermined value or less, regardless of changes in the other various conditions. Specifically, arbitrary values of the saturation magnetization of the magnetic garnet film, the film thickness thereof, the wavelength of the basic standing wave thereof and the intensity of external magnetic field to be applied to the magnetic garnet film were selected from the ranges of 0 to 0.176 Wb/m², 5 to 150 µm, 250 µm to 4 mm and 0 to 1.592×10⁵ A/m, respectively, and combined. And, with regard to each combination, $t_1+t_2$ (value obtained by deducting the thickness of the magnetic garnet film from the distance between a pair of the two ground conductors sandwiching the magnetic garnet film) was varied in the range of from 10 µm to 1 mm, and loaded $Q_1$ and unloaded $Q_u$ were determined by calculation in each case. As a result, it has been found that loaded $Q_1$/unloaded $Q_u$ increases with a decrease in $t_1+t_2$, and that all the loaded $Q_1$/unloaded $Q_u$ values exist above a solid line shown in FIG. 10. That is, it has been revealed that the loaded $Q_1$/unloaded $Q_u$ always rises if $t_1+t_2$ is set at 500 µm or less.

The unloaded $Q_u$ varies depending upon combinations of the above various conditions, while it does not depend upon $t_1+t_2$. Therefore, an increase in the loaded $Q_1$/unloaded $Q_u$ with a decrease in $t_1+t_2$ in each combination means that the loaded $Q_1$ increases with a decrease in $t_1+t_2$ in each combination.

As described above, in the present invention, by controlling the distance between the ground conductor sandwiching the magnetic garnet film in the magnetostatic wave resonator, specifically, by satisfying $t_1+t_2 \leq 500$ µm, preferably $t_1+t_2 \leq 400$ µm, the loaded $Q_1$ can be increased regardless of the other conditions. For attaining the function of a magnetostatic wave device, it is required to provide a predetermined distance or more between the RF signal feeder line and the ground conductor. Since it is sufficient to provide a distance of at least 5 µm as the above distance, the present invention employs $t_1 \geq t_R+5$ µm when the thickness of the RF signal feeder line is $t_R$ (see FIG. 1). On the other hand, the magnetic garnet film and the ground conductor may be in contact, and therefore, $t_2 \geq 0$ µm The ratio of $t_1$ and $t_2$ is not specially limited, and it can be properly determined depending upon a use field of the magnetostatic wave device. For example, when it is used in a region of relatively low frequency, generally, $t_1>t_2$ is employed. In the case of $t_1>t_2$, $t_1+t_2 \leq 300$ µm is employed, whereby a more preferable result can be obtained.

In the present invention, the magnetic reluctance of a closed magnetic circuit formed of the void 9b—the magnetic pole piece 7b—the yoke 12a—the magnetic pole piece 7a—the void 9a—the magnetic pole piece 8a—the yoke 12b—the magnetic pole piece 8b in the magnetic field generator shown in FIG. 3A can be decreased by decreasing the distance between the ground conductors, so that the coils 17 can generate an intense magnetic field at small currents or with a smaller winding number for the coils. The volume of the coils can be therefore decreased, whereby the magnetic field generator as a whole can be decreased in size.

The present invention can be also applied to the configuration shown in FIG. 4, i.e., a configuration in which the void 9, the permanent magnet 11 and the coil 17 are arranged in series in the height direction. In the configuration of FIG. 4, however, it is difficult to control the height of the magnetostatic wave device as a whole even if $t_1+t_2$ is controlled according to the present invention, i.e., even if the void length of the void 9 is controlled so as to be small, the configuration of FIG. 4 is difficult to decrease in size. In contrast, it is easy to control the height of the magnetostatic wave device in the configuration shown in FIG. 2 and FIG. 3A.

EXPERIMENTAL EXAMPLES

For verifying the effect of the present invention, the following experiments were carried out.

Experimental Example 1 (when $t_1=t_2$)

A magnetic garnet film having a size of 1 mm square, a thickness of 20 µm and a saturation magnetization of 0.07 W/m² was used as such, a U-letter-shaped electrode having a thickness of 6 µm was used as an RF signal feeder line, the intensity of an external magnetic field was set such that the central frequency of resonance was 700 MHz, $t_1==t_2$ was employed, and $t_1+t_2$ was varied as shown in Table 1, to determine loaded Q./unloaded Q. In addition, $t_2$ was adjusted by changing the thickness of a GGG substrate. Table 1 shows the results. "Relative value of loaded $Q_1$/unloaded $Q_u$" shown in Table 1 refers to a relative value obtained by calculation on the condition that the loaded $Q_1$/unloaded $Q_u$ when $t_1+t_2=800$ µm is 100, and it is also used in this sense in Experimental Examples to be described later.

TABLE 1

($t_1 = t_2$)

| Sample No. | $t_1 + t_2$ (µm) | Relative value of loaded $Q_1$/ unloaded $Q_u$ |
| --- | --- | --- |
| 101 | 200 | 226 |
| 102 | 400 | 135 |
| 103 | 500 | 117 |
| 104 (Comparative) | 800* | 100 |

*Outside the limited range

Experimental Example 2 (when $t_2$ is fixed)

The same settings as those in Example 1 were used except that the thickness of a magnetic garnet film was changed to 30 µm, that the form of an RF signal feeder line was changed to an S-letter-shaped form and that the distance $t_2$ was fixed at 50 μm, and $t_1$ was changed as shown in Table 2, to determine loaded $Q_1$/unloaded $Q_u$. Table 2 shows the results.

TABLE 2

($t_2$ = 50 μm)

| Sample No. | $t_1$ (μm) | $t_1 + t_2$ (μm) | Relative value of loaded $Q_1$/ unloaded $Q_u$ |
|---|---|---|---|
| 201 | 150 | 200 | 135 |
| 202 | 200 | 250 | 123 |
| 203 | 250 | 300 | 115.5 |
| 204 | 300 | 350 | 110 |
| 205 | 350 | 400 | 107 |
| 206 | 450 | 500 | 103.5 |
| 207 (Comparative) | 750 | 800* | 100 |

*Outside the limited range

Example 3 (when $t_2$=0)

The same settings as those in Example 1 were used except that the thickness of a magnetic garnet film was changed to 10 μm, that the saturation magnetization thereof was changed to 0.14 Wb/m², that the intensity of an external magnetic field was set such that the central frequency of resonance was 2,000 MHz and that no GGG substrate was provided, i.e., that the distance $t_2$ was set at 0 μm, and $t_1$ was changed as shown in Table 3, to determine loaded $Q_1$/unloaded $Q_u$. Table 3 shows the results.

TABLE 3

($t_2$ = 0 μm)

| Sample No. | $t_1 + t_2$ (μm) | Relative value of loaded $Q_1$/ unloaded $Q_u$ |
|---|---|---|
| 101 | 200 | 137 |
| 102 | 250 | 121 |
| 103 | 300 | 111.5 |
| 104 | 350 | 106.5 |
| 105 | 400 | 104 |
| 106 | 500 | 102 |
| 107 (Comparative) | 800* | 100 |

*Outside the limited range

Tables 1 to 3 shows that the loaded $Q_1$/unloaded $Q_u$ is sharply increased by bringing $t_1+t_2$ into the predetermined range.

INDUSTRIAL UTILITY

The present invention has been explained with reference to magnetostatic wave resonators hereinabove, while it is evident to one of ordinary skill in the art that the present invention is not limited to magnetostatic wave resonators but permits various alterations and modifications within the scope recited in claim and can be applied to other magnetostatic wave devices such as resonator type magnetostatic wave filters.

I claim:

1. A magnetostatic wave device comprising:
   a magnetic garnet film configured to excite and to propagate magnetostatic waves upon receiving electromagnetic waves,
   a magnetic field generator configured to apply a magnetic field to the magnetic garnet film,
   first and second ground conductors opposing each other and sandwiching the magnetic garnet film therebetween, the first ground conductor having an opposing surface opposed to a first main surface of the magnetic garnet film, the second ground conductor having an opposing surface opposed to a second main surface of the magnetic garnet film, and
   an RF signal feeder line disposed between the magnetic garnet film and the first ground conductor,
   wherein:

$t_1 \geq t_R + 5$ μm $t_2 \geq 0$ μm, and $t_1 + t_2 \leq 500$ μm in which $t_1$ is a distance between the opposing surface of the first ground conductor and the first main surface of the magnetic garnet film, $t_2$ is a distance between the opposing surface of the second ground conductor and the second opposing surface of the magnetic garnet film and $t_R$ is a thickness of the RF signal feeder line.

2. A device according to claim 1, wherein:

$t_1 > t_2$, and $t_1 + t_2 \leq 300$ μm.

3. A device according to claim 1, wherein $t_1 = t_2$.
4. A device according to claim 1, wherein $t_1 = 50$ μm.
5. A device according to claim 1, wherein $t_2 = 0$ μm.
6. A device according to claim 1, wherein the magnetic field generator is configured to apply a DC magnetic field perpendicular to the magnetic garnet film.
7. A device according to claim 1, wherein the magnetic garnet film comprises a yttrium iron garnet.
8. A device according to claim 1, further comprising an adhesive layer between the magnetic garnet film and the RF signal feeder.
9. A device according to claim 1, further comprising a substrate located between the magnetic garnet film and the RF signal feeder.
10. A device according to claim 9, wherein the substrate comprises a gadolinium gallium garnet.
11. A magnetostatic wave device comprising:
    a magnetic garnet film configured to excite and to propagate magnetostatic waves upon receiving electromagnetic waves;
    first and second ground conductors opposing each other and sandwiching the magnetic garnet film therebetween, the first ground conductor having an opposing surface opposed to a first main surface of the magnetic garnet film, the second ground conductor having an opposing surface opposed to a second main surface of the magnetic garnet film;
    an RF signal feeder line disposed between the magnetic garnet film and the first ground conductor; and
    a magnetic field generator configured to apply a magnetic field to the magnetic garnet film, said magnetic field generator comprising,
       a permanent magnet,
       a pair of yokes opposed to each other and each having a first end portion magnetically connected to the permanent magnet, said yokes each having a second end portion facing each other and defining a first void in which the magnetic garnet film is located, said yokes each having a middle portion facing each other and defining a second void, and coils wound around the second void, said coils being configured to generate a variable magnetic field so as to vary the intensity of the magnetic field applied to the magnetic garnet film;

wherein:

$$t_1 \geq t_R + 5 \ \mu m$$

$$t_2 \geq 0 \ \mu m, \text{ and}$$

$$t_1 + t_2 \leq 500 \ \mu m$$

in which $t_1$ is a distance between the opposing surface of the first ground conductor and the first main surface of the magnetic garnet film, $t_2$ is a distance between the opposing surface of the second ground conductor and the second opposing surface of the magnetic garnet film and $t_R$ is a thickness of the RF signal feeder line.

12. A device according to claim 11, wherein the yokes comprise a member of the group consisting of iron and an iron-nickel alloy.

13. A device according to claim 12, wherein the yokes comprise iron.

14. A device according to claim 13, further comprising a conducting film configured to shield the yokes.

15. A device according to claim 11, further comprising at least one support including a non-magnetic and electrically conductive material and configured to support the second end portions of the yokes.

16. A device according to claim 15, further comprising:

a conducting film configured to shield the second end portions of the yokes, and an electrically conductive adhesive configured to bond the conducting film to said at least one support.

17. A device according to claim 16, wherein the electrically conductive adhesive comprises silver paste.

* * * * *

UNITED STATES PATENT AND TRADEMARK OFFICE
CERTIFICATE OF CORRECTION

| | | |
|---|---|---|
| PATENT NO. | : 6,114,929 | Page 1 of 1 |
| DATED | : September 5, 2000 | |
| INVENTOR(S) | : Hitoyoshi Kurata | |

It is certified that error appears in the above-identified patent and that said Letters Patent is hereby corrected as shown below:

On the title page, item [30], the Foreign Application Priority Data, has been omitted. Item [30] should read as follows:

Jul. 24, 1997     [JP] Japan.................................... 9-214083

Signed and Sealed this

Fifth Day of June, 2001

Attest:

Attesting Officer

NICHOLAS P. GODICI
*Acting Director of the United States Patent and Trademark Office*